(12) United States Patent
Atlas

(10) Patent No.: US 6,822,202 B2
(45) Date of Patent: Nov. 23, 2004

(54) SEMICONDUCTOR PROCESSING TEMPERATURE CONTROL

(75) Inventor: Boris Atlas, San Jose, CA (US)

(73) Assignee: Oriol, Inc., Santa Clara, CA (US)

( * ) Notice: Subject to any disclaimer, the term of this patent is extended or adjusted under 35 U.S.C. 154(b) by 34 days.

(21) Appl. No.: 10/097,603

(22) Filed: Mar. 15, 2002

(65) Prior Publication Data

US 2003/0173351 A1 Sep. 18, 2003

(51) Int. Cl.[7] ............................. H05B 1/02; F24F 3/00
(52) U.S. Cl. ........................ 219/494; 219/509; 165/206
(58) Field of Search ................................ 219/482, 490, 219/494, 509, 510; 165/206, 294, 263, 100, 64, 80.4, 261, 254, 272; 425/144, 378.1; 264/40.6

(56) References Cited

U.S. PATENT DOCUMENTS

| | | | | |
|---|---|---|---|---|
| 3,847,209 A | * | 11/1974 | Mascall | 165/206 |
| 4,621,678 A | * | 11/1986 | Hahn et al. | 165/64 |
| 4,729,424 A | * | 3/1988 | Mizuno et al. | 165/261 |
| 4,984,628 A | * | 1/1991 | Uchida et al. | 165/63 |
| 5,348,076 A | * | 9/1994 | Asakawa | 165/282 |
| 5,579,826 A | * | 12/1996 | Hamilton et al. | 165/254 |
| 6,026,896 A | * | 2/2000 | Hunter | 165/206 |

* cited by examiner

Primary Examiner—Tu Ba Hoang
(74) Attorney, Agent, or Firm—McKenna Long & Aldridge LLP

(57) ABSTRACT

A temperature control system having a re-circulation loop that uses valves to selectively circulate a temperature control fluid through a cooling system, through a heating system, or through a through passage so as to controlling the temperature of the temperature control fluid, which, in turn, controls the temperature of a target. A temperature sensor monitors the target's temperature. A controller controls valve operation in response to the temperature measured by the temperature sensor to obtain a predetermined target temperature. Beneficially, the controller controls the target's temperature according to a predetermined temperature profile. Continuous etching along a predetermined temperature profile is possible.

17 Claims, 7 Drawing Sheets

SEMICONDUCTOR PROCESSING TEMPERATURE CONTROL

BACKGROUND OF THE INVENTION

1. Field of the Invention

The present invention relates to semiconductor processing temperature control. More specifically, it relates to controlling the temperature of a semiconductor processing device (target) using a temperature control fluid that is selectively heated and cooled. The temperature of the semiconductor processing device (target) is variable over time according to a predetermined temperature profile.

2. Discussion of the Related Art

Semiconductor device manufacturing involves a large number of processing steps, such as semiconductor crystal growth, wafer cutting, wafer polishing, doping, material depositions, oxide growths, masking, and etching. Because modem semiconductors must be low cost and highly reliable, rapid fabrication with high device yields and with tight tolerances is critical. That generally requires automated equipment and processes in specially designed clean rooms.

While clean rooms are generally successful, they are expensive to build and operate, with the cost being highly dependent on floor space. Thus, only the processing steps that must be performed in a clean room are usually performed there. Furthermore, it is beneficial to minimize the device processing and wafer handling steps required to be performed in a clean room. Many of the steps performed in clean rooms require heating and/or cooling. For example, since etching is highly temperature dependent, the etching temperature of each etching step (there might be several) must be carefully controlled. Increasing etching difficult is that as semiconductors get denser, the need for accurate temperature control becomes greater. Thus, a semiconductor wafer might be etched at a carefully controlled first temperature, then etched at a carefully controlled second temperature, and then etched at a carefully controlled third temperature, and so on.

In prior art semiconductor processing, multiple etchings typically required the semiconductor wafers being processed to be moved between different etching vessels that are maintained at different temperatures. This increased the risk of wafer contamination, necessitated multiple etching vessels and temperature control systems, increased processing time, and increased the required clean room floor space. An alternative was to etch the semiconductor wafers in one vessel at one temperature, remove the semiconductor wafers, change the vessel's temperature, re-insert the semiconductor wafers, and then repeating the process as required. Semiconductor wafer removal was required because it was very difficult or impossible to rapidly change a vessel's temperature, and because it was very difficult or impossible to control the temperature's rate of change.

In clean rooms, temperature control is usually achieved by pumping a temperature control fluid through a semiconductor processing vessel, chamber, tool, device, or assembly, all of which are generically referred to hereinafter as targets. The temperature control fluid is usually heated or cooled using a heat exchanger, with heat flow being dependent on temperature requirements. Typically, electrically controlled valves are used to adjust the control fluid's flow through a heat exchanger. Thus, prior art semiconductor process temperature controls use various types of pipes, pumps, thermostats, heat exchangers, temperature controllers, refrigeration units, heaters, valves, and temperature control fluids.

While beneficial, prior art semiconductor process temperature controls usually either cooled or heated targets, but not both. Systems that both heated and cooled usually used separate temperature control fluids. That is, a fixed volume of temperature control fluid was used for heating, while another fixed volume was used for cooling. Such systems required multiple circulation pipes through the targets, which increased cost and reduced reliability.

However, U.S. Pat. No. 6,026,896 discloses a semiconductor process temperature control system in which control valves switch the temperature control fluid that passes through the target (reference FIG. 3, valve 74, and the supporting text of U.S. Pat. No. 6,026,896). U.S. Pat. No. 6,026,896 thus teaches selectively controlling the temperature control fluid (heated or cooled) that flows through the target. While the system disclosed in U.S. Pat. No. 6,026,896 is beneficial, multiple pumps, numerous control valves, and extensive piping are still required. Furthermore, temperature adjustment and regulation requires rapid valve switching and flushing of the temperature control fluid. This can detrimentally impact reliability because of thermal stresses and pressure mismatches between the heating and cooling subsystems. Furthermore, mass mixing between the heated and cooled temperature control fluids leads to increased power consumption because previously heated temperature control fluid must be cooled, while previously cooled temperature control fluid must be heated.

Therefore, a semiconductor temperature process control system that can heat and cool using the same temperature control fluid would be beneficial. Even more beneficial would be a semiconductor temperature process control system that uses only one volume of temperature control fluid and that requires only one temperature control fluid pump. Still more beneficial would be a semiconductor temperature process control system that uses only one volume of temperature control fluid, that uses only one temperature control fluid pump, and that has reduced thermal shock and reduced valve switching. More beneficial yet would be an efficient semiconductor temperature process control system that uses only one volume of temperature control fluid, that uses only one temperature control fluid pump, and that has low thermal shock and reduced valve switching. Such a system having variable temperatures that change according to well-defined temperature profiles (well-controlled rates of temperature change) would be highly beneficial in that such would enable continuous etching of a semiconductor wafer at different temperatures that change according to a predetermined temperature profile.

SUMMARY OF THE INVENTION

The following summary of the invention is provided to facilitate an understanding of some of the innovative features unique to the present invention, and is not intended to be a full description. A full appreciation of the various aspects of the invention can be gained by taking the entire specification, claims, drawings, and abstract as a whole.

Accordingly, the principles of the present invention are directed to a semiconductor process temperature control system that heats and cools a target using one temperature control fluid. Beneficially, the principles of the present invention are implemented using a re-circulation loop that is pressurized by one pump (or one pumping system). The principles of the present invention can be implemented with low thermal shock and reduced valve switching, and thus with improved reliability. Furthermore, the principles of the present invention can be implemented with relatively high efficiency.

A semiconductor process temperature control system according to the principles of the present invention includes a re-circulation loop for retaining and circulating a volume of temperature control fluid such that the temperature control fluid is in thermal communication with a target whose temperature is being controlled. The temperature control fluid is circulated through the re-circulation loop by a fluid pump. The re-circulation loop includes control valves that selectively enable some of the temperature control fluid to flow through a cooling heat exchanger, through a heating heat exchanger, or through neither heat exchanger. The control valves are controlled by a controller, which receives temperature information that is related to the temperature of the target from at least one temperature sensor. Based on the temperature information, some of the temperature control fluid is passed through a selected heat exchanger such that the target achieves a predetermined temperature. Beneficially the controller further receives time information from a timer. In such cases, the controller controls the flow of the temperature control fluid such that the temperature of the target follows a predetermined temperature profile. This enables continuous etching of a semiconductor wafer at different temperatures that change according to a well-defined temperature profile.

Beneficially, the re-circulation loop retains a volume of temperature control fluid such that the temperature control fluid can change temperatures relatively rapidly. Furthermore, the re-circulation loop beneficially passes only part of the temperature control fluid through a heat exchanger. This reduces thermal stress and stabilizes re-circulation loop pressures.

Furthermore, the temperature sensor is beneficially located such that it accurately senses a temperature that is related to the target. To that end, the temperature sensor beneficially senses the target temperature, the temperature of an object in thermal communication with the target, or the temperature of the temperature control fluid as the temperature control fluid leaves the target area.

A semiconductor process temperature control system according to the principles of the present invention enables beneficial semiconductor processing methods. For example, a method of continuously etching a semiconductor wafer includes etching a semiconductor wafer at a first temperature, adjusting the etch temperature along a well-defined temperature profile to a second temperature while continuing to etch, and subsequently etching the semiconductor wafer at the second temperature. Beneficially, etching is performed at the first temperature for a predetermined time, and then at the second temperature for another predetermined period of time. Furthermore, the etching temperature during the temperature adjustment from the first temperature to the second temperature beneficially occurs over a predetermined time.

A semiconductor process temperature control system according to the principles of the present invention can include multiple individual temperature control systems that share heating and/or cooling resources. The temperature profiles of a plurality of targets can be controlled. Of course, a plurality of temperature sensors for sensing the temperatures of the individual targets, a plurality of temperature control units for controlling the temperatures of the individual targets, and a plurality of re-circulation loops for isolating the temperature control fluids for the individual targets are required. Such re-circulation loops can include circulation pumps and control valves.

It is to be understood that both the foregoing general description and the following detailed description are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this specification, illustrate embodiments of the invention and together with the description serve to explain the principles of the invention.

In the drawings.

DETAILED DESCRIPTION OF THE ILLUSTRATED EMBODIMENT

Reference will now be made in detail to an illustrated embodiment of the invention, the example of which is shown in the accompanying drawings.

Figure 1:
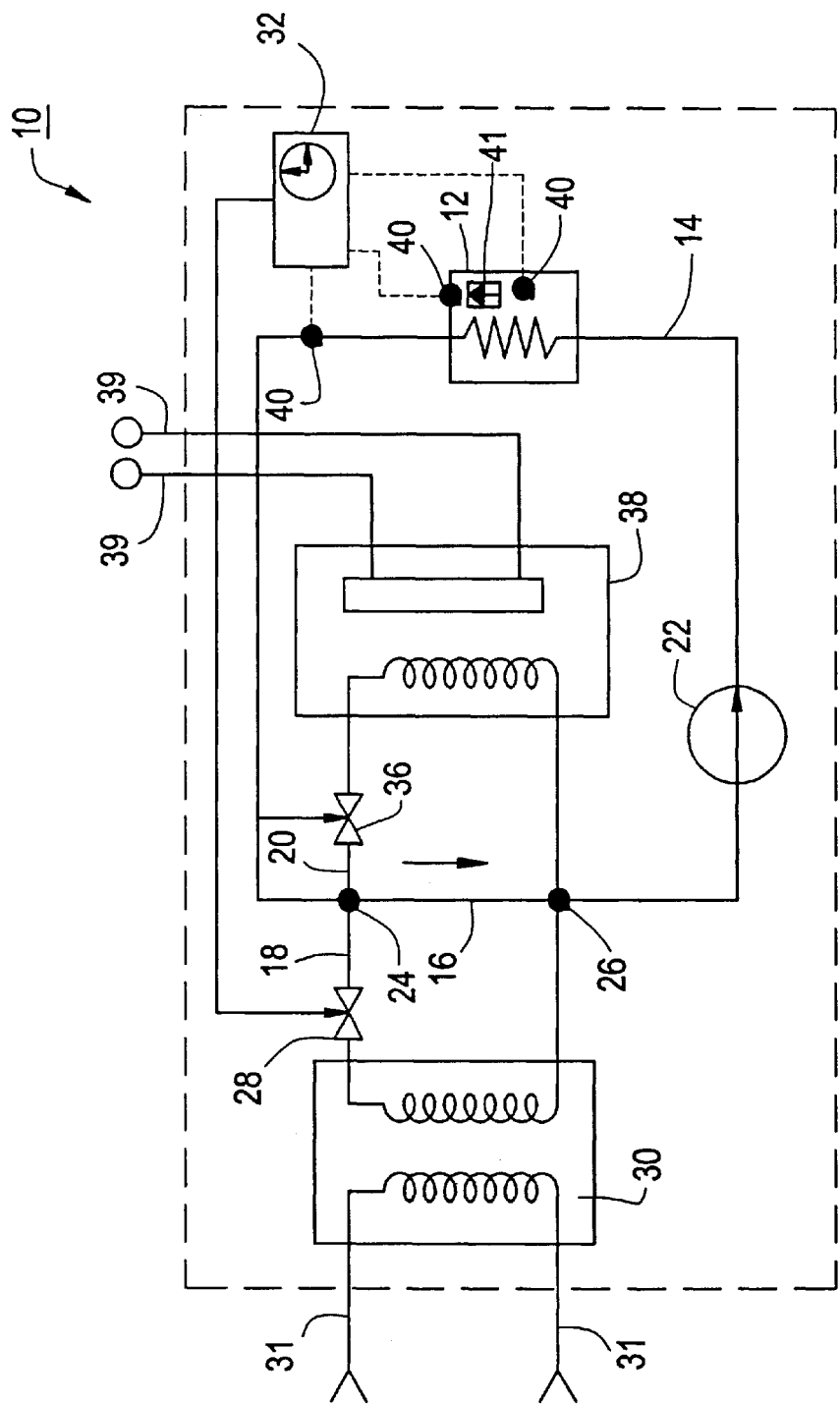
FIG. 1 is a schematic diagram of a temperature control system that is in accord with the principles of the present invention.

FIG. 1 illustrates a semiconductor process temperature control system 10 that is in accord with the principles of the present invention. The semiconductor process temperature control system 10 both heats and cools a target 12, as required, using a temperature control fluid in a re-circulation loop 14. The re-circulation loop 14 includes a through passage 16, a cooling passage 18, and a heating passage 20. The temperature control fluid is pumped through the re-circulation loop 14 by a pump 22.

Still referring to FIG. 1, the through passage 16, the cooling passage 18, and the heating passage 20 are in parallel. They meet at a first branch 24 and at a second branch 26. The through passage 16 transports some of the temperature control fluid directly from the first branch 24 to the second branch 26. The cooling passage 18 includes a cooling valve 28 and a cooling heat exchanger 30 that is cooled by lines 31 that transport a refrigerated cooling fluid. The cooling valve 28 is electrically operated under the control of a controller 32. The heating passage 20 includes a heating valve 36 and a heating heat exchanger 38. The heating heat exchanger receives power or heat on lines 39. For example, the lines 39 might be electrical wires that supply power to a resistive heat source in the heating heat exchanger 38, or the lines 39 might transport a heated fluid through the heating heat exchanger. The heating valve 36 is also electrically operated under the control of the controller 32.

The controller 32 receives temperature information from at least one temperature sensor 40. That temperature sensor is in thermal communication with the target 12 such that target temperature information is available to the controller 32. The temperature sensor 40 could be in direct thermal contact with the target 12, in thermal contact with a material in or on the target, or in thermal contact with the temperature control fluid, beneficially as the temperature control fluid leaves the target area. More than one temperature sensor 40 can supply information to the controller 32.

In operation, the controller 32 is programmed to set the temperature of the target 12 at predetermined temperatures at predetermined times, with the temperatures always being greater than the lowest temperature achievable from the cooling heat exchanger 30, but always less than the highest temperature achievable from the heating heat exchanger 38. If the temperature information from the temperature sensor 40 shows that the target temperature is less than the programmed temperature at the particular moment in time, the controller 32 opens the heating valve 36. This enables some of the temperature control fluid to flow through the heating heat exchanger 38, which heats the temperature control fluid. That heated temperature control fluid then mixes with the temperature control fluid that passes through the through passage 16, thus causing the temperature of the temperature control fluid to rise. This causes the target temperature to rise. When the target temperature is correct, the controller 32 closes the heating valve 36.

Alternatively, if the temperature information from the temperature sensor 40 shows that the target temperature is greater than the programmed temperature at the particular instant, the controller opens the cooling valve 28. This enables some of the temperature control fluid to flow through the cooling heat exchanger 30, which cools the temperature control fluid. That cooled temperature control fluid mixes with the temperature control fluid that passes through the through passage 16, thus causing the temperature of the temperature control fluid to drop. This causes the target temperature to drop. When the target temperature is correct, the controller 32 closes the cooling valve 28.

The controller 32 beneficially proportionally controls the temperature. That is, if a desired temperature is far from the measured temperature, the controller 32 causes significant heating or cooling. Then, as the current temperature approaches the desired temperature the rate of heating/cooling decreases.

Figure 2:
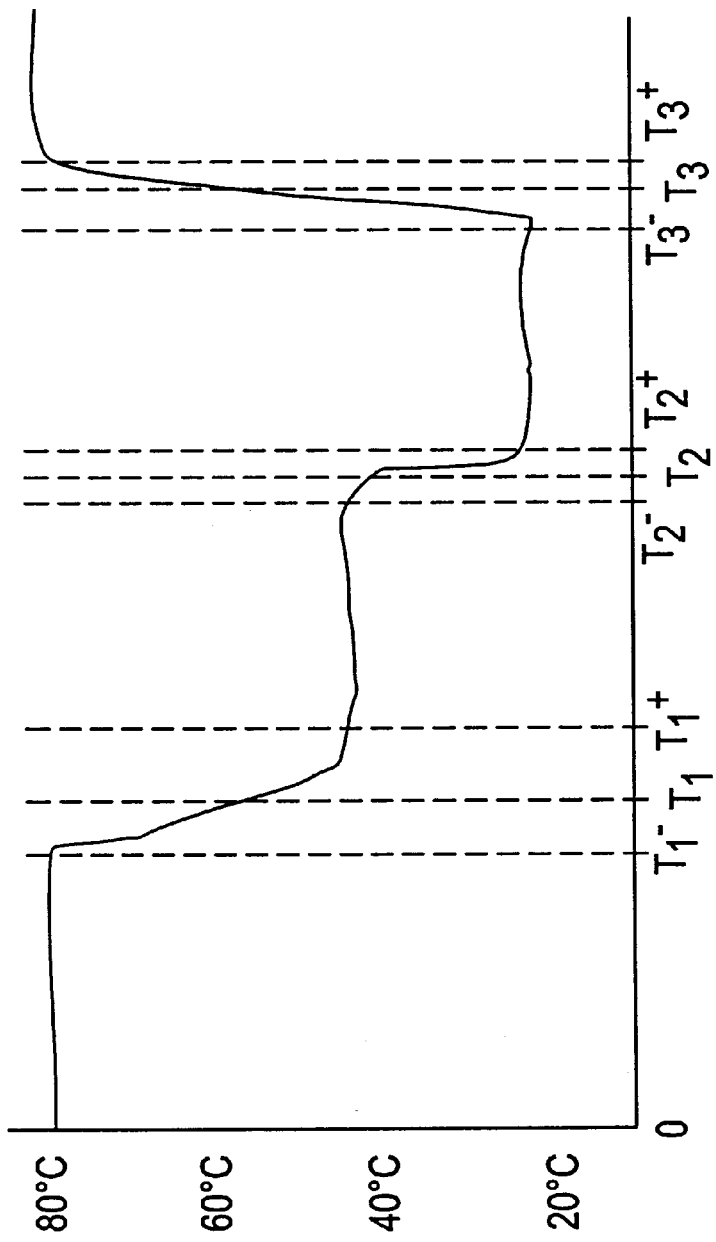
FIG. 2 illustrates a temperature profile of a target during etching.

Furthermore, the controller 32 beneficially can be programmed such that the target temperature changes over time according to a predetermined temperature profile. This is extremely beneficial in some applications. For example, FIG. 2 illustrates a desired temperature profile of a target in which (or by which) a semiconductor wafer is being etched. Assume that the semiconductor wafer is to be etched at different rates at different times using the same etchant. Further assume, as is usually the case, that the etch rate is temperature dependent. At time 0, the semiconductor process temperature control system 10 sets the target 12 at a first temperature, say 80° C., which induces a desired first etch rate. After a time T1, the etch rate ideally should be at a second temperature, say 40° C., which induces a second etch rate. As an instantaneous temperature change is not possible, shortly before time T1 (at say T1−) the controller 32 begins adjusting the flow of the temperature control fluid in a controlled manner through the cooling valve 28. This controlled adjustment enables a repeatable temperature change profile. This enables the etch process designer to implement a continuous etch system having known etch characteristics along a temperature change. After some temperature adjustment time, say at time T1+, the target temperature is at the second temperature and etching continues at the second etch rate.

Later, say at time T2, the etch rate should changes to a third rate. Shortly before time T2 (at say T2−) the controller 32 begins adjusting the flow of the temperature control fluid in a controlled manner through the cooling valve 28. This adjusts the target temperature along a predetermined and repeatable temperature profile curve to a third temperature, say 20° C., which induces a third etch rate. After some temperature adjustment time, say at time T2+, the target temperature is at the third temperature. Finally, at a later time, say at time T3, the etch rate should change back to the first rate. Then, shortly before time T3 (at say T3−) the controller 32 begins adjusting the flow of the temperature control fluid in a controlled manner through the heating valve 36. This adjusts the target temperature along a predetermined and repeatable temperature profile curve back to the first temperature. After some temperature adjustment time, say at time T3+, the target temperature is back at the first temperature. To assist ease of operation, and to enable changes in the temperature profiles, the controller 32 beneficially operates under software control. An example of an etch process that benefits from continuous etching along a controlled temperature profile is provided subsequently.

Turning back to FIG. 1, the blending of heated/cooled temperature control fluid with temperature control fluid that passes through the through passage 16 enables both heating and cooling with the same temperature control fluid. Furthermore, sharp thermal shocks and pressure disturbances are avoided. Additionally, the closed re-circulation loop 14 minimizes the volume of temperature control fluid that must be heated and cooled to change the temperature of the target 12. This enables relatively rapid temperature changes, which can be important in applications like that described above with reference to FIG. 2 (and subsequently described with reference to FIGS. 4A–4F). Additionally, only one pump (or pump system) is required for both heating and cooling. Another benefit of the semiconductor process temperature control system 10 is that rapid switching of the valves 28 and 36 are not required to maintain a fixed temperature. That is, if both valves are closed the only temperature control fluid that is circulated is through the through passage 16. If that temperature control fluid is at or near the desired fixed temperature, cycling between heating and cooling is not required.

Figure 3:
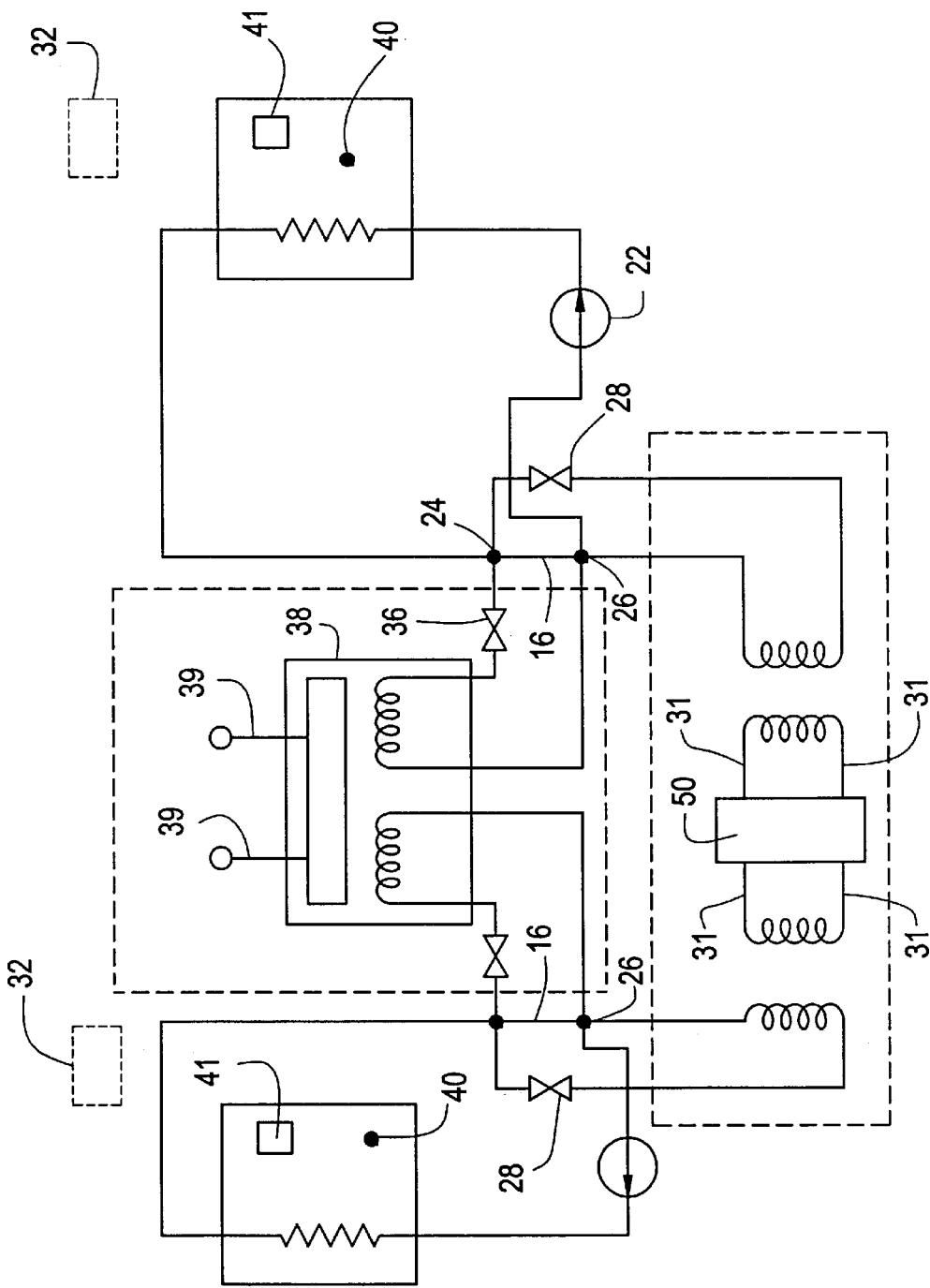
FIG. 3 is a schematic diagram of a temperature control system that is in accord with the principles of the present invention and that includes multiple temperature controlled targets.

FIG. 3 illustrates a multiple target temperature control system 100 that is in accord with the principles of the present invention. The target temperature control system 100 is essential comprised of paralleled temperature control systems 10. However, the temperature control system 100 can control the temperatures of multiple targets 12. Each target has its own re-circulation loop 14 with through passage 16, cooling passage 18, and heating passage 20. Furthermore, each target 12 has an associated volume of temperature control fluid that is pumped through the target's associated re-circulation loop 14 by a pump 22. Additionally, each re-circulation loop 14 includes a first branch 24, a second branch 26, a cooling valve 28, a cooling heat exchanger 30 cooled by lines 31, and a heating valve 36. However, the temperature control system 100 beneficially includes a single heat exchanger 38 and a single cooling source 50. As shown, each target 12 also has an associated temperature sensor 40 that feeds temperature information to a temperature control unit 32. There might be one temperature control unit 32 or multiple temperature control units.

Still referring to FIG. 3, the cooling heat exchanger 50 cools a refrigerated cooling fluid in lines 31. The refrigerated cooling fluid in lines 31 subsequently cool fluids in the individual re-circulation loops 14 (a set for each target) via cooling heat exchangers 30. Similarly, the heat exchanger 38 heats the heating fluids in each of the individual re-circulation loops 14.

It is more economical to locate as much of each temperature control unit as possible outside of the clean room. Thus, FIG. 3 shows much of the heating and cooling units being located in a utility room 64, which is beneficially outside of clean rooms that house the targets 12.

Figure 4A:
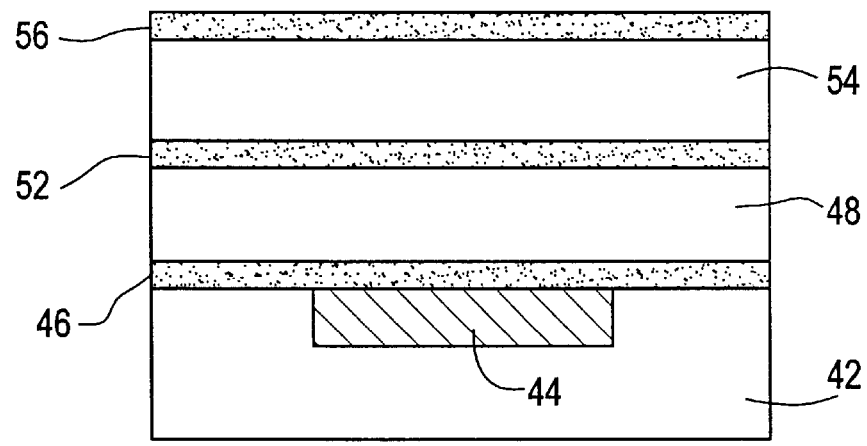
FIGS. 4A–4F illustrate a fabrication process that benefits from temperature control systems that are in accord with the principles of the present invention.

As previously noted, the temperature control units 10 and 100 are highly beneficial in that they enable continuous etching of a target 12 as the target's temperature is adjusted in accord with a predetermined temperature profile. This enables a new level of semiconductor fabrication performance. For example, FIGS. 4A through 4F illustrate a special contact formation process that benefits from the principles of the present intention. The process begins with a structure as shown in FIG. 4A. That structure includes a copper plug 44 embedded in a silicon layer 42. Over the copper plug 44 and silicon layer 42 is a first nitride layer 46. Over the first nitride layer 46 is a first polyimide layer 48, which is capped by a second nitride layer 52. Over the second nitride layer 52 is a second polyimide layer 54, which is capped by a metal hardmask 56.

Figure 4B:
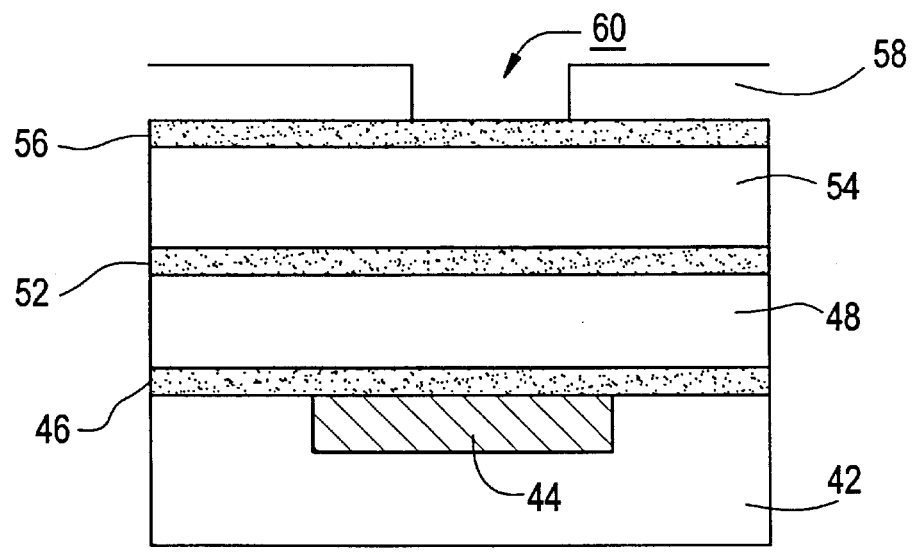
Figure 4C:
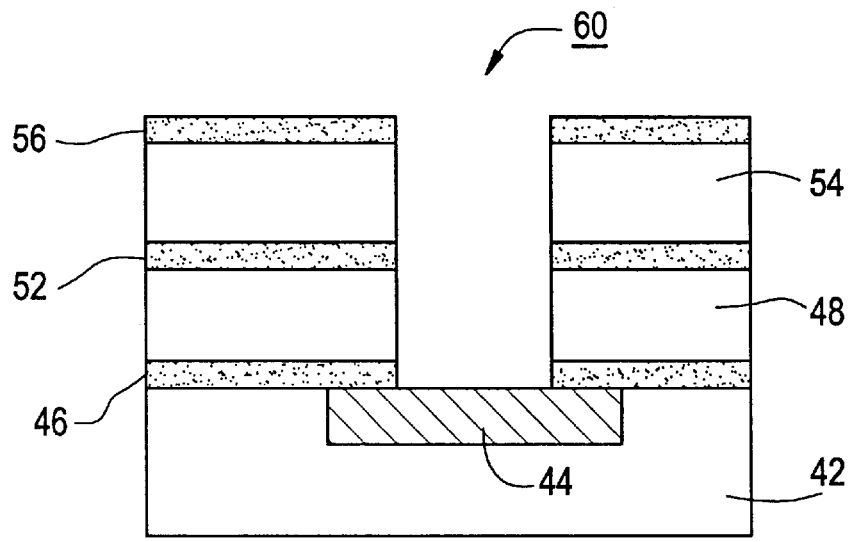

Referring now to FIG. 4B, processing begins by depositing a resist layer 58 on the metal hardmask 56 at a temperature of 40° C., and then by etching the resist layer 58 to form an opening 60. Turning now to FIG. 4C, after the opening 60 is formed, the opening is driven toward the copper plug 44. First, the temperature of the structure is changed to 50° C. and an aperture is formed through the metal hardmask 56. This removes the remaining photoresist 58. Then, the temperature is adjusted to 40° C. and the second polyimide layer 54 is etched. Then, the temperature is adjusted once again to 50° C. and the second nitride layer 52 is etched. Then, the temperature is adjusted once again to 40° C. and the first polyimide layer 48 is etched. Finally, the temperature is adjusted once again to 50° C. and the first nitride layer 46 is etched. This exposes the copper plug 44. It should be noted that etching is continuous, with only the etch temperature being changed.

Figure 4D:
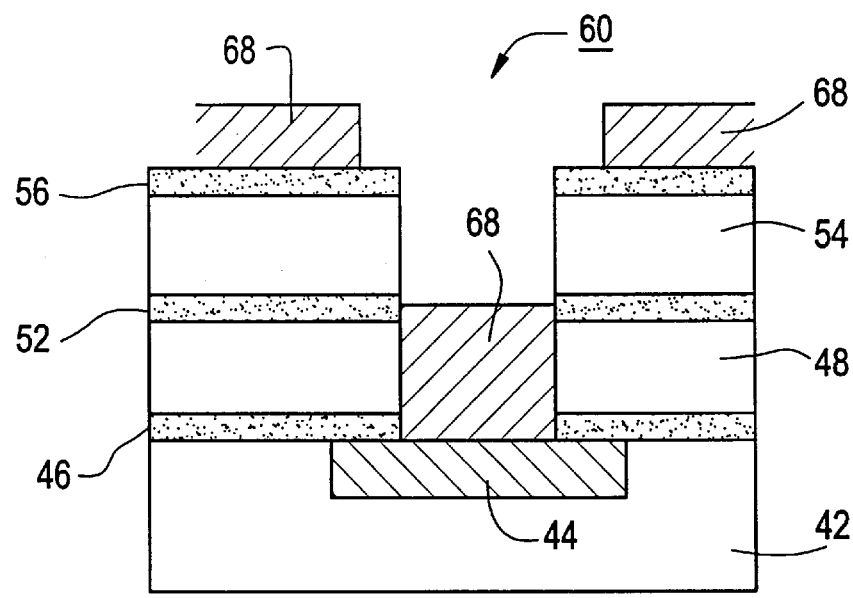
Figure 4E:
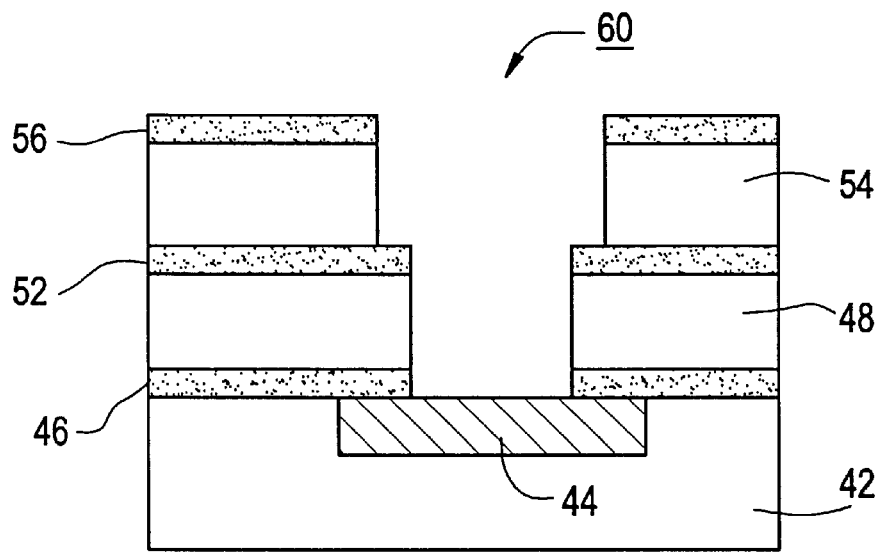
Figure 4F:
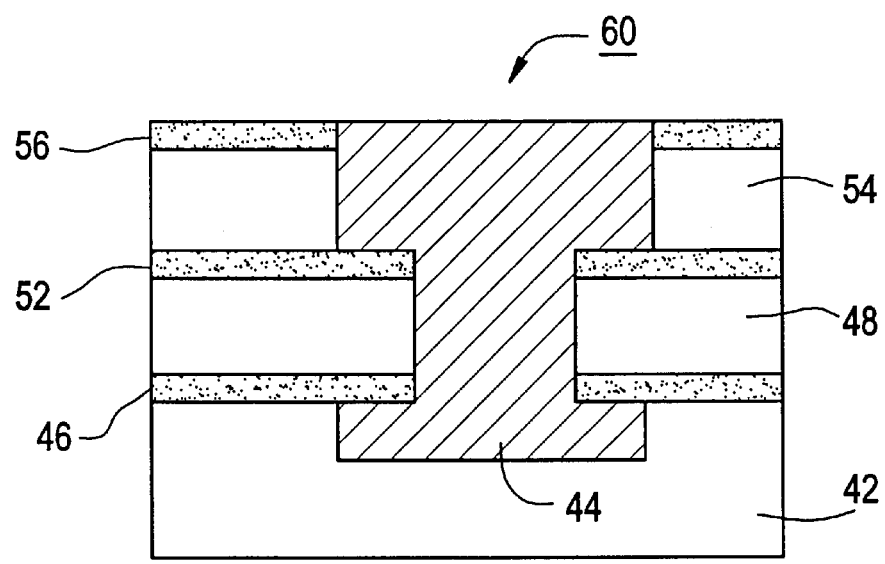
Figure 5:
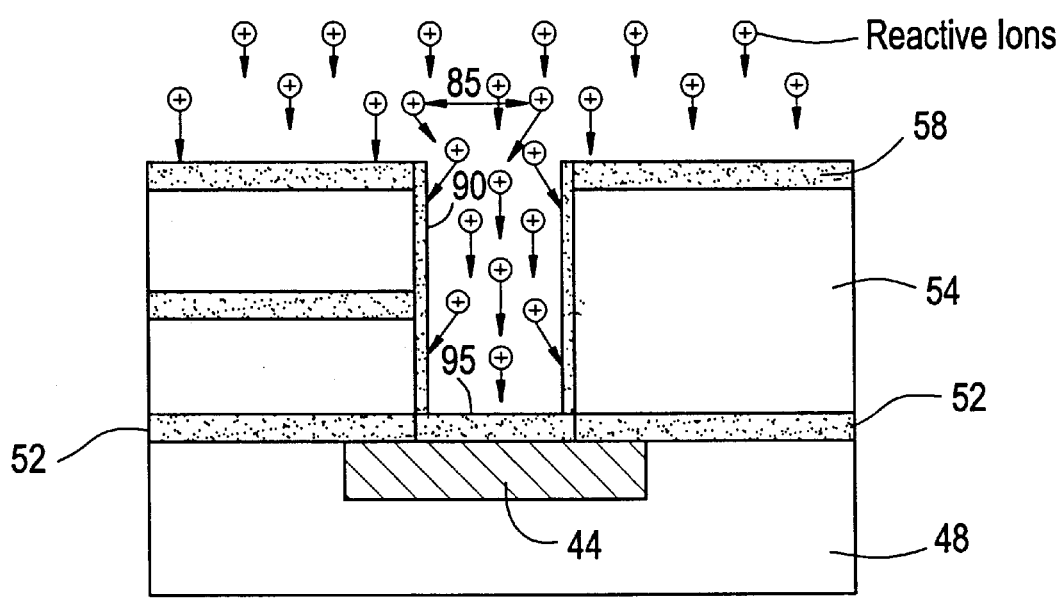
FIG. 5 illustrates fabrication process that benefits from temperature control systems that are in accord with the principles of the present invention.

Referring now to FIG. 4D, another photoresist layer 68 is then deposited on the exposed portion of the copper plug 44 and on the exposed portion of the metal hardmask 56. The photoresist layer is then patterned to widen expose part of the metal hardmask 56 adjacent the opening 60. Next, referring to FIG. 4E, the temperature of the structure is raised to about 40° C. and the photoresist layer 68 is removed. This results in exposed top portions of the metal hardmask 56 and of the second nitride layer 52. Then, the temperature of the structure is changed to room temperature. Referring now to FIG. 4F, copper is then electroplated into the opening 60 to form the now finished contact 44.

It should be noted that all the foregoing processes are implement temperature selective etching. Furthermore, all etching performed with reference to FIG. 4C is performed continuously.

The embodiments and examples set forth herein are presented to best explain the present invention and its practical application and to thereby enable those skilled in the art to make and utilize the invention. Those skilled in the art, however, will recognize that the foregoing description and examples have been presented for the purpose of illustration and example only. Other variations and modifications of the present invention will be apparent to those of skill in the art, and it is the intent of the appended claims that such variations and modifications be covered. The description as set forth is not intended to be exhaustive or to limit the scope of the invention. Many modifications and variations are possible in light of the above teaching without departing from the spirit and scope of the following claims. It is contemplated that the use of the present invention can involve components having different characteristics. It is intended that the scope of the present invention be defined by the claims appended hereto, giving full cognizance to equivalents in all respects.

What is claimed is:

1. A temperature control system, comprising:
    a target having a target temperature;
    a temperature sensor for sensing said target temperature;
    a controller operatively connected to said temperature sensor, said controller for producing cooling control signals and heating control signals;
    a re-circulation loop for retaining a temperature control fluid such that the temperature control fluid is in thermal communication with said target, said re-circulation loop including:
        a pump for circulating said temperature control fluid;
        a cooling heat exchanger;
        a cooling control valve;
        a cooling fluid passage interconnecting said cooling heat exchanger and said cooling control valve;
        a heating heat exchanger;
        a heating control valve;
        a heating fluid passage interconnecting said heating heat exchanger and said heating control valve; and
        a through passage;
    wherein said cooling control valve selectively enables part of said temperature control fluid to circulate through said cooling heat exchanger in response to said cooling control signals;
    wherein said heating control valve selectively enables part of said temperature control fluid to circulate through said heating heat exchanger in response to said heating control signals; and
    wherein said controller selectively produces said cooling control signals and said heating control signals such that said target temperature moves toward a predetermined temperature.

2. A temperature control system according to claim 1, wherein at least part of said temperature control fluid flows through said through passage.

3. A temperature control system according to claim 1, wherein said cooling passage, said heating passage, and said through passage are in parallel.

4. A temperature control system according to claim 1, wherein temperature control fluid in said cooling heat exchanger is cooled below said predetermined temperature.

5. A temperature control system according to claim 1, wherein temperature control fluid in said heating heat exchanger is heated above said predetermined temperature.

6. A temperature control system according to claim 1, wherein said target includes an etching solution.

7. A temperature control system according to claim 1, wherein said temperature sensor is in thermal communication with said target.

8. A temperature control system according to claim 1, wherein said temperature sensor is in thermal communication with temperature control fluid leaving said target.

9. A temperature control system according to claim 1, wherein said cooling heat exchanger receives a refrigerated fluid.

10. A temperature control system according to claim 1, wherein said heating heat exchanger receives a heated fluid.

11. A temperature control system according to claim 1, wherein said heating heat exchanger receives electrical power.

12. A temperature control system according to claim 1, wherein said pump forces temperature control fluid to circulate through said cooling heat exchanger, through said heating heat exchanger, and through said through passage.

13. A temperature control system according to claim 1, wherein said controller selectively produces said cooling control signals and said heating control signals such that said target temperature follows a predetermined temperature profile.

14. A temperature control system according to claim 1, wherein said controller includes a timer.

15. A temperature control system, comprising:
- a heating heat exchanger;
- a cooling heat exchanger;
- a first target having a first target temperature;
- a first temperature sensor for sensing said first target temperature;
- a first re-circulation loop for retaining a first temperature control fluid such that the first temperature control fluid is in thermal communication with said first target, said first re-circulation loop including:
  - a first pump for circulating said first temperature control fluid;
  - a first cooling control valve for selectively circulating said first temperature control fluid into said cooling heat exchanger in response to a first cooling signal;
  - a first cooling fluid passage interconnecting said cooling heat exchanger and said first cooling control valve;
  - a first heating control valve for selectively circulating said first temperature control fluid into said heating heat exchanger in response to a first heating signal;
  - a first heating fluid passage interconnecting said heating heat exchanger and said first heating control valve; and
  - a first through passage;
- a second target having a second target temperature;
- a second temperature sensor for sensing said second target temperature;
- a second re-circulation loop for retaining a second temperature control fluid such that the second temperature control fluid is in thermal communication with said second target, said second re-circulation loop including:
  - a second pump for circulating said second temperature control fluid;
  - a second cooling control valve for selectively circulating said second temperature control fluid into said cooling heat exchanger in response to a second cooling signal;
  - a second cooling fluid passage interconnecting said cooling heat exchanger and said second cooling control valve;
  - a second heating control valve for selectively circulating said second temperature control fluid into said heating heat exchanger in response to a second heating signal;
  - a second heating fluid passage interconnecting said heating heat exchanger and said second heating control valve; and
  - a second through passage; and
- a controller operatively connected to said first temperature sensor and to said second temperature sensor, said controller for producing said first and second cooling signals and said first and second heating control signals such that said first target temperature and said second target temperature are at predetermined levels.

16. A temperature control system according to claim 15, wherein said first temperature control fluid and said second temperature control fluid do not mix.

17. A temperature control system according to claim 15, wherein said first target temperature and said second target temperature are independent of one another.

* * * * *